(12) United States Patent
Tsao et al.

(10) Patent No.: US 7,595,234 B2
(45) Date of Patent: Sep. 29, 2009

(54) FABRICATING METHOD FOR A METAL OXIDE SEMICONDUCTOR TRANSISTOR

(75) Inventors: Po-Chao Tsao, Taipei County (TW); Chang-Chi Huang, Miaoli (TW); Ming-Tsung Chen, Hsinchu County (TW); Yi-Yiing Chiang, Taipei (TW); Yu-Lan Chang, Kaohsiung (TW); Chung-Ju Lee, Hsinchu Hsien (TW); Chih-Ning Wu, Hsinchu (TW); Kuan-Yang Liao, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 103 days.

(21) Appl. No.: 11/532,100

(22) Filed: Sep. 15, 2006

(65) Prior Publication Data

US 2007/0066041 A1 Mar. 22, 2007

Related U.S. Application Data

(62) Division of application No. 11/162,693, filed on Sep. 20, 2005, now Pat. No. 7,214,988.

(51) Int. Cl.
*H01L 21/336* (2006.01)
(52) U.S. Cl. ............... 438/199; 438/231; 438/232; 438/581; 438/583; 257/E21.438; 257/E21.439

(58) Field of Classification Search ............. 438/592, 438/199, 581
See application file for complete search history.

(56) References Cited

U.S. PATENT DOCUMENTS 7,265,425 B2 * 9/2007 Chen et al. .............. 257/382
2004/0188771 A1 * 9/2004 Yaung et al. ............. 257/382

* cited by examiner

*Primary Examiner*—Brook Kebede
*Assistant Examiner*—Tony Tran
(74) *Attorney, Agent, or Firm*—Chun-Ming Shih

(57) ABSTRACT

A method for forming a metal oxide semiconductor (MOS) transistor is provided. First, a gate structure is formed over a substrate. Then, offset spacers are formed on respective sidewalls of the gate structure. A first ion implantation process is performed to form a lightly doped drain (LDD) in the substrate beside the gate structure. Other spacers are formed on respective sidewalls of the offset spacers. Thereafter, a second ion implantation process is performed to form source/drain region in the substrate beside the spacers. Then, a metal silicide layer is formed on the surface of the source and the drain. An oxide layer is formed on the surface of the metal silicide layer. The spacers are removed and an etching stop layer is formed on the substrate. With the oxide layer over the metal silicide layer, the solvent for removing the spacers is prevented from damaging the metal silicide layer.

22 Claims, 4 Drawing Sheets

FABRICATING METHOD FOR A METAL OXIDE SEMICONDUCTOR TRANSISTOR

CROSS-REFERENCE TO RELATED APPLICATION

This is a divisional application of patent application Ser. No. 11/162,693, filed on Sep. 20, 2005 and is now pending. The entirety of the above-mentioned patent application is hereby incorporated by reference herein and made a part of this specification.

BACKGROUND OF THE INVENTION

1. Field of the Invention

The present invention relates to a fabricating method for a metal oxide semiconductor (MOS) transistor. More particularly, the present invention relates to a fabricating method for a metal oxide semiconductor (MOS) transistor capable of preventing the metal silicide layer inside the MOS transistor from any damages.

2. Description of the Related Art

In the fabricating process of metal oxide semiconductor (MOS) transistors, spacers are often removed after forming a metal silicide layer to increase channel mobility. Thereafter, according to whether the MOS transistor is an n-type or a p-type device, a high-tensile or high-compression dielectric layer is formed on the substrate to serve as a contact etching stop layer (CESL).

However, most spacers are fabricated using silicon nitride material so that spacers are generally removed using hot phosphoric acid. Thus, in the process of removing the spacers, the metal silicide layer may be damaged by a significant quantity of hot phosphoric acid. In particular, the damage inflicted upon the metal silicide layer when the metal silicide layer is made of nickel silicide is more severe. Ultimately, the performance of the transistor device is adversely affected.

SUMMARY OF THE INVENTION

Accordingly, at least one objective of the present invention is to provide a metal oxide semiconductor (MOS) transistor having a well-protected metal silicide layer.

At least a second objective of the present invention is to provide a method of forming a metal oxide semiconductor (MOS) transistor capable of preventing the metal silicide layer inside the MOS transistor from any damage, so that the overall performance of the device can be maintained.

To achieve these and other advantages and in accordance with the purpose of the invention, as embodied and broadly described herein, the invention provides a metal oxide semiconductor (MOS) transistor. The MOS transistor comprises a substrate, a gate structure, offset spacers, a lightly doped drain (LDD), a source and a drain, a metal silicide layer, an oxide layer and an etching stop layer. The gate structure is disposed on the substrate and the offset spacers are disposed on the respective sidewalls of the gate structure. The LDD is disposed in the substrate beside the gate structure. The source and the drain are disposed in the substrate outside the LDD beside the gate structure. The metal silicide layer is formed on the surface of the source and the drain. The oxide layer is disposed on the surface of the metal silicide layer. The etching stop layer is disposed over the substrate to cover the oxide layer, the offset spacers and the gate structure.

According to the aforementioned MOS transistor in the embodiment of the present invention, the oxide layer has a thickness between about 10 Å to 30 Å.

According to the aforementioned MOS transistor in the embodiment of the present invention, the etching stop layer is fabricated using silicon nitride.

According to the aforementioned MOS transistor in the embodiment of the present invention, the material constituting the metal silicide layer is selected from a group consisting of nickel silicide, cobalt silicide, platinum silicide, palladium silicide, molybdenum silicide and an alloy of some of the aforementioned silicide materials.

According to the aforementioned MOS transistor in the embodiment of the present invention, the offset spacers can be fabricated using silicon oxide or the offset spacer can be a composite layer comprising an oxide/nitride/oxide (ONO) stack.

According to the aforementioned MOS transistor in the embodiment of the present invention, the offset spacer has a thickness smaller than 400 Å.

According to the aforementioned MOS transistor in the embodiment of the present invention, the gate structure comprises a gate oxide layer, a polysilicon layer and a cap layer. The polysilicon layer is disposed over the gate oxide layer and the cap layer is disposed over the polysilicon layer.

The present invention also provides a method of forming a metal oxide semiconductor (MOS) transistor. First, a substrate is provided. Then, a gate structure is formed over the substrate. Thereafter, offset spacers are formed on the respective sidewalls of the gate structure. A first ion implantation process is performed to form a lightly doped drain (LDD) in the substrate beside the gate structure. After that, other spacers are formed on respective sidewalls of the offset spacers. Then, a second ion implantation process is performed to form a source and a drain in the substrate beside the spacers. A metal silicide layer is formed on the surface of the source and the drain. After that, an oxide layer is formed over the surface of the metal silicide layer and then the spacers are removed. Subsequently, an etching stop layer is formed over the substrate to cover the oxide layer, the offset spacers and the gate structure.

According to the aforementioned manufacturing method in the embodiment of the present invention, the method of forming an oxide layer over the surface of the metal silicide layer includes performing an oxygen ($O_2$) plasma treatment.

According to the aforementioned manufacturing method in the embodiment of the present invention, the process of forming an oxide layer on the surface of the metal silicide layer and then removing the spacers, includes the following steps. First, a portion of the spacers is removed using hot phosphoric acid so that a portion of the spacers remains. Then, a de-ionized water (DI water) rinsing operation or a de-ionized water-ozone (DI-$O_3$) treatment is performed to form the oxide layer. After that, hot phosphoric acid is again applied to remove the remaining spacers.

According to the aforementioned manufacturing method in the embodiment of the present invention, the oxide layer has a thickness between about 10 Å to 30 Å.

According to the aforementioned manufacturing method in the embodiment of the present invention, the etching stop layer is fabricated using silicon nitride.

According to the aforementioned manufacturing method in the embodiment of the present invention, the material constituting the metal silicide layer is selected from a group consisting of nickel silicide, cobalt silicide, platinum silicide, palladium silicide, molybdenum silicide and an alloy of some of the aforementioned silicide materials.

According to the aforementioned MOS transistor in the embodiment of the present invention, the offset spacers can be fabricated using silicon oxide or the offset spacer can be a composite layer comprising an oxide/nitride/oxide (ONO) stack.

In the present invention, a thin oxide layer is formed over the metal silicide layer before removing the spacers. Hence, the metal silicide layer is protected against the damage of phosphoric acid used for removing the spacers.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
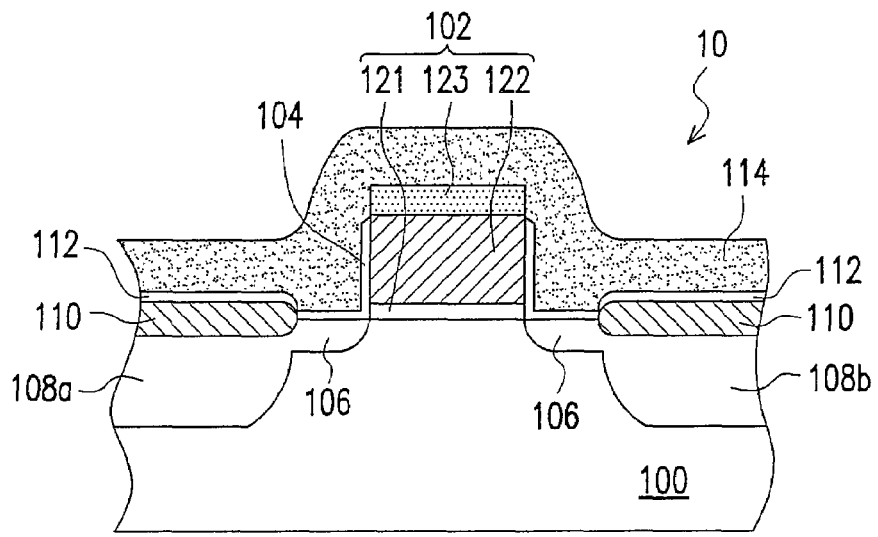
FIG. 1 is a schematic cross-sectional view of a metal oxide semiconductor transistor according to an embodiment of the present invention.

Reference will now be made in detail to the present embodiments of the invention, examples of which are illustrated in the accompanying drawings. Wherever possible, the same reference numbers are used in the drawings and the description to refer to the same or like parts.

FIG. 1 is a schematic cross-sectional view of a metal oxide semiconductor (MOS) transistor according to an embodiment of the present invention. As shown in FIG. 1, the MOS transistor in the present embodiment comprises a substrate 100, a gate structure 102, a pair of offset spacers 104, a pair of lightly doped drains (LDD) 106, a source 108a and a drain 108b, a metal silicide layer 110, an oxide layer 112 and an etching stop layer 114. The oxide layer 112 has a thickness between about 10 Å to 30 Å, for example. The etching stop layer 114 is fabricated using silicon nitride, for example. The metal silicide layer is fabricated using a material selected from a group consisting of nickel silicide, cobalt silicide, platinum silicide, palladium silicide, molybdenum silicide and an alloy of some of the aforementioned silicide materials, for example. The offset spacers 104 are fabricated using silicon oxide, for example. Alternatively, the offset spacers 104 can be oxide/nitride/oxide composite stack layers. In general, the offset spacers have a thickness smaller than 400 Å.

As shown in FIG. 1, the gate structure 102 is disposed on the substrate 100 and the offset spacers 104 are disposed on the respective sidewalls of the gate structure 102. The LDD 106 is disposed in the substrate 100 beside the gate structure 104 and the source 108a and the drain 108b are disposed in the substrate outside the LDD 106 beside the gate structure 102. Furthermore, the metal silicide layer 110 is disposed on the surface of the source 108a and the drain 108b. The oxide layer 112 is disposed on the surface of the metal silicide layer 110 to protect the metal silicide layer 110 against possible damage by the corrosive solvent used in a spacer removal process. The etching stop layer 114 is disposed on the substrate 100 to cover the oxide layer 112, the offset spacers 104 and the gate structure 102. In addition, the gate structure 102 further comprises a gate oxide layer 121, a polysilicon layer 122 and a cap layer 123. The polysilicon layer 122 is formed over the gate oxide layer 121 and the cap layer 123 is formed over the polysilicon layer 122.

Figure 2A:
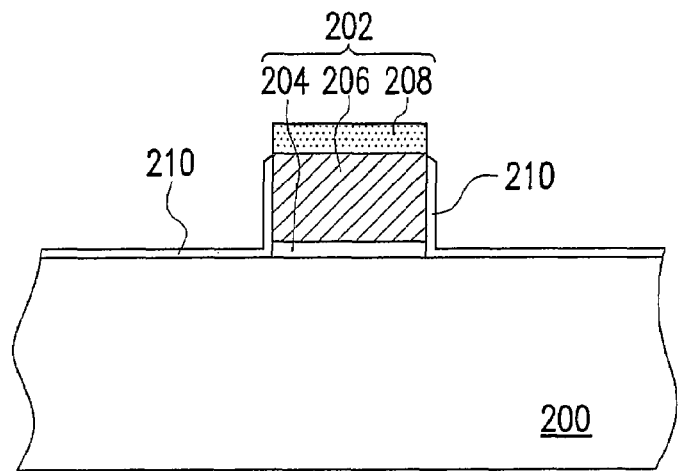
FIGS. 2A through 2H are schematic cross-sectional views showing the steps for fabricating a metal oxide semiconductor transistor according to the embodiment of the present invention.

FIGS. 2A through 2H are schematic cross-sectional views showing the steps for fabricating a metal oxide semiconductor transistor according to the embodiment of the present invention. As shown in FIG. 2A, a substrate 200 is provided. Then, a gate structure 202 is formed over the substrate 200. The gate structure 202 comprises a gate oxide layer 204, a polysilicon layer 206 and a cap layer 208 sequentially formed over the substrate 200. Thereafter, offside spacers 210 are formed on the respective sidewalls of the gate structure 202. The offset spacers 210 are silicon oxide layer or an oxide/nitride/oxide (ONO) composite stack layer, for example. At this processing stage, some offset spacer material may cover the surface of the substrate.

Figure 2B:
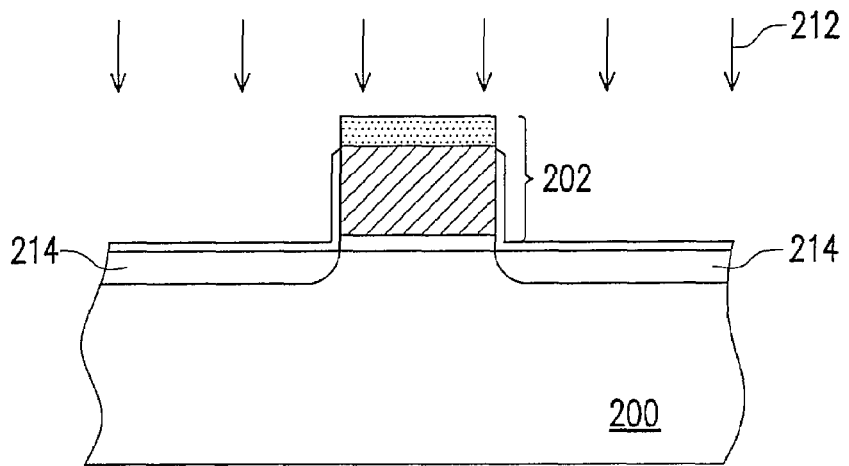

As shown in FIG. 2B, a first ion implantation process 212 is performed to form lightly doped drains (LDD) 214 in the substrate 200 beside the gate structure 202.

Figure 2C:
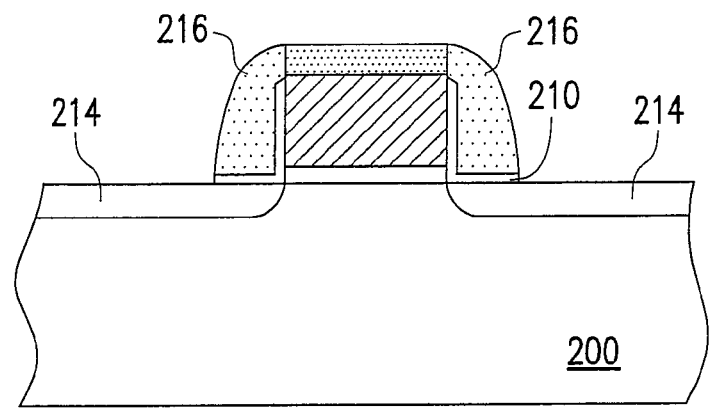

As shown in FIG. 2C, other spacers 216 are formed on respective sidewalls of the offset spacers 210. The spacers 216 are fabricated using silicon nitride, for example. Furthermore, the process of forming the spacers 216 may include removing a portion of the offset spacers 210 not covered by the spacers 216.

Figure 2D:
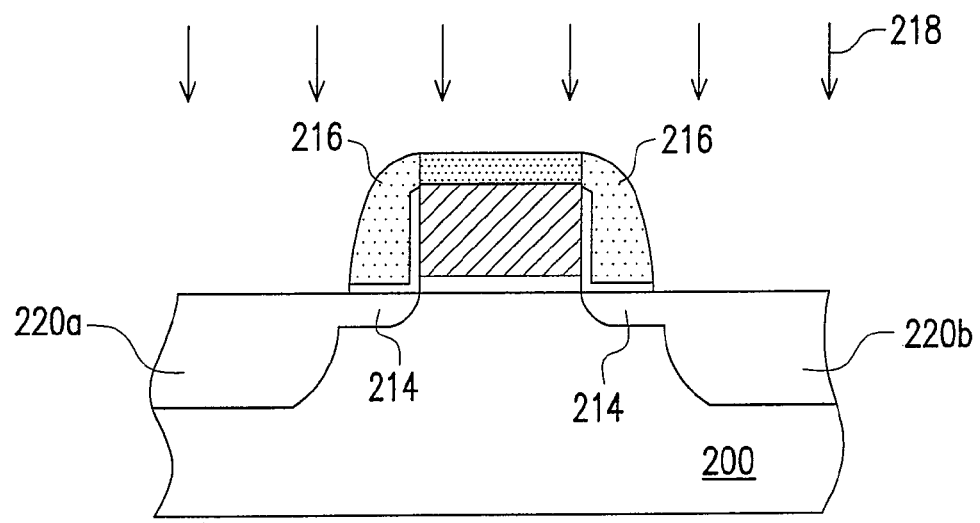

As shown in FIG. 2D, a second ion implantation process 218 is performed to form a source 220a and a drain 220b in the substrate beside the aforementioned spacers 216.

Figure 2E:
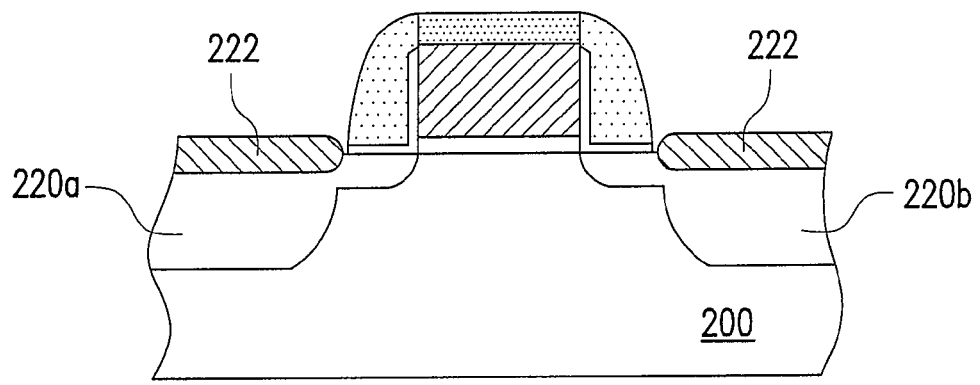

As shown in FIG. 2E, a metal silicide layer 222 is formed on the surface of the source 220a and the drain 220b. The metal silicide layer 222 is fabricated using a material selected from a group consisting of nickel silicide, cobalt silicide, platinum silicide, palladium silicide, molybdenum silicide and an alloy of the aforementioned silicide materials. The method of forming the metal silicide layer 222 includes depositing metallic material over the substrate 200 to form a metallic layer and activating the metal in the metallic layer to react with the silicon in the substrate 200 to form the metal silicide layer 222. Lastly, the metallic material not participating in the reaction is removed.

Figure 2F:
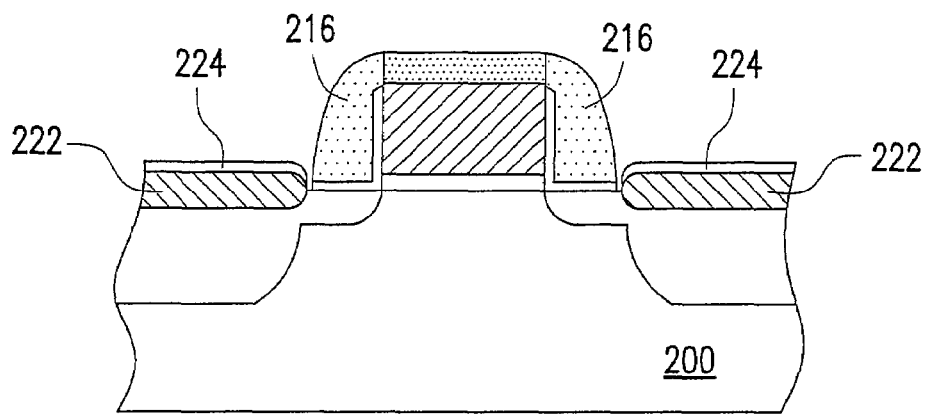

As shown in FIG. 2F, an oxide layer 224 is formed on the surface of the metal silicide layer 222 so that the metal silicide layer 222 is protected when the spacers 216 are subsequently removed. The oxide layer 224 has a thickness between about 10 Å~30 Å, for example.

Figure 2G:
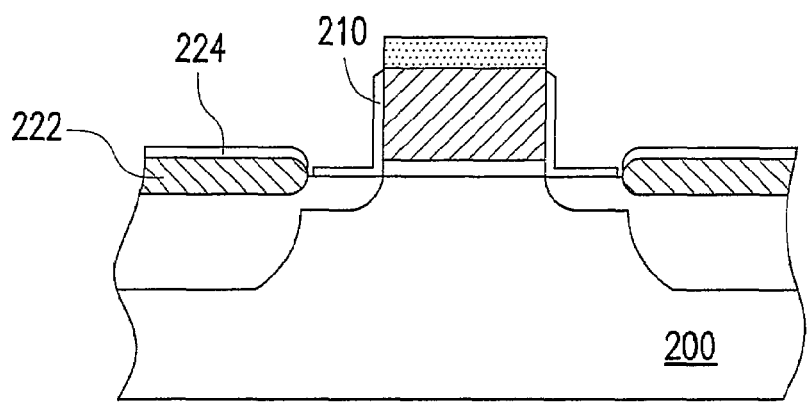

As shown in FIG. 2G, the spacers 216 are removed. For example, hot phosphoric acid may be applied to remove the spacers 216.

Figure 2H:
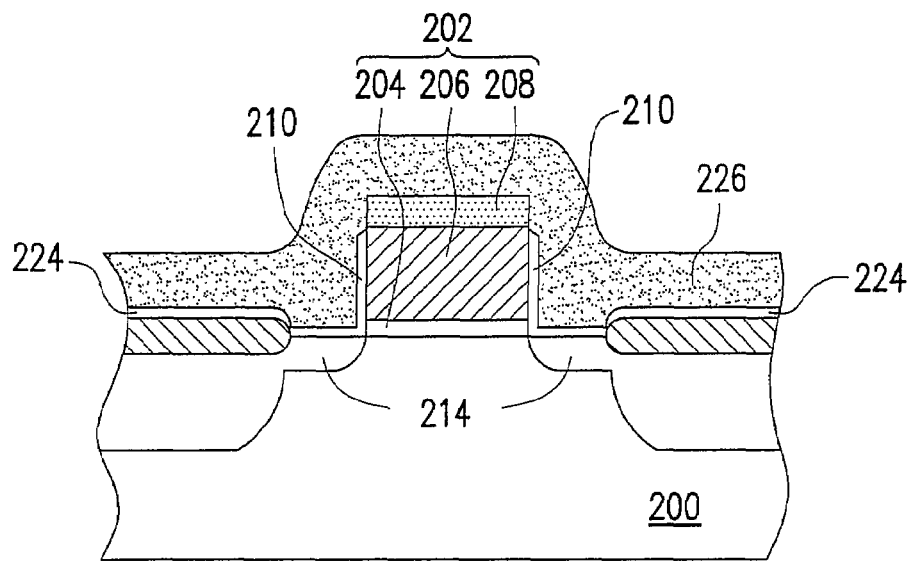

As shown in FIG. 2H, an etching stop layer 226 is formed over the substrate 200 to cover the oxide layer 224, the offset spacers 210 and the gate structure 202. The etching stop layer 226 is fabricated using a highly adaptable dielectric material such as silicon nitride.

Figure 3:
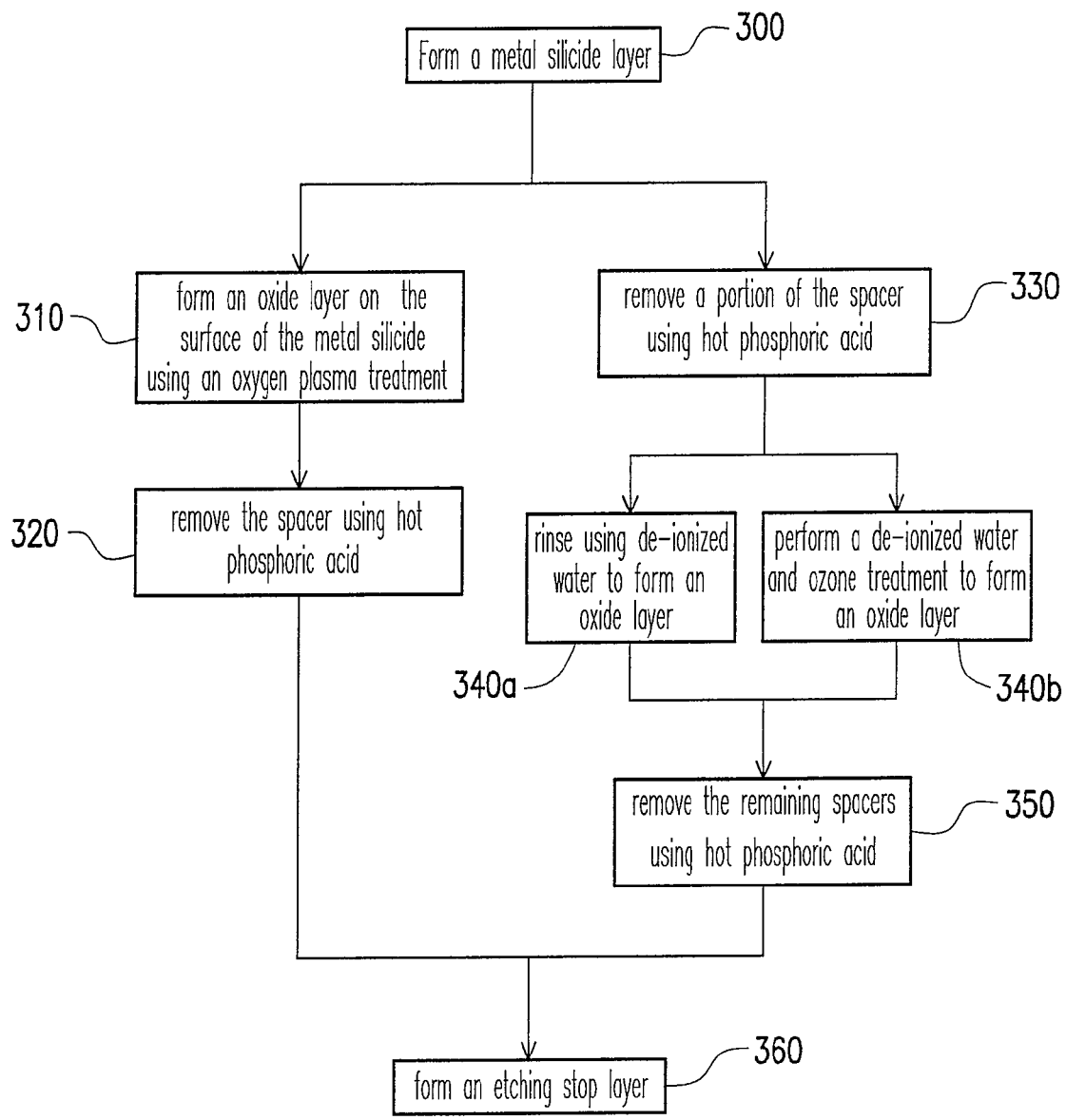
FIG. 3 is a flow diagram showing the steps shown in FIGS. 2E to 2H.

The steps performed in FIGS. 2E~2H are laid out in FIG. 3. FIG. 3 is a flow diagram showing the steps shown in FIGS. 2E to 2H. As shown in FIG. 3, the step of forming the metal silicide layer in step 300 is the process in FIG. 2E. Thereafter, either the step 310 or the step 330 is performed.

In step 310, an oxygen ($O_2$) plasma treatment is performed to form an oxide layer on the surface of the metal silicide layer. Thereafter, step 320 is performed to remove the spacers using hot phosphoric acid.

In addition, the step 330 is performed after performing the step 300. A portion of the spacers will be removed by the hot phosphoric acid. However, some spacer material will remain.

Thereafter, either a rinsing operation using de-ionized water (DI water) is performed in step 340a or a de-ionized water and ozone (DI-$O_3$) treatment is performed in step 340b to form the aforementioned oxide layer. Then, in step 350, hot phosphoric acid is applied to remove the remaining spacer material.

Finally, after the steps 320 and 350, the step 360 is performed to form the etching stop layer (that is, the step in FIG. 2H).

In summary, an oxide layer is formed over the metal silicide layer in the present invention. This prevents the metal silicide layer from any possible damage in the process of removing the spacers. Hence, the channel mobility is increased while the metal silicide layer is protected at the same time.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a metal oxide semiconductor (MOS) transistor, comprising:
   providing a substrate;
   forming a gate structure on the substrate;
   forming an offset spacer on respective sidewalls of the gate structure;
   performing a first ion implantation process to form a lightly doped drain (LDD) in the substrate beside the gate structure;
   forming a spacer on respective sidewalls of the offset spacer;
   performing a second ion implantation process to form a source and a drain in the substrate beside the spacer;
   forming a metal silicide layer on the surface of the source and the drain;
   forming an oxide layer only on the surface of the metal silicide layer, wherein the oxide layer fully covers the surface of the metal silicide layer;
   removing the spacer after the oxide layer is formed; and
   forming an etching stop layer over the substrate to cover the oxide layer, the offset spacer and the gate structure.

2. The method of claim 1, wherein the step of forming the oxide layer on the surface of the metal silicide layer includes performing an oxygen ($O_2$) plasma treatment.

3. The method of claim 1, wherein the material constituting the spacers comprises silicon nitride.

4. The method of claim 1, wherein the oxide layer has a thickness between about 10 Å to 30 Å.

5. The method of claim 1, wherein the material constituting the etching stop layer comprises silicon nitride.

6. The method of claim 1, wherein the material constituting the metal silicide is selected from a group consisting of nickel silicide, cobalt silicide, platinum silicide, palladium silicide, molybdenum silicide and an alloy of some of the above metal silicide.

7. The method of claim 1, wherein the material constituting the offset spacers comprises silicon oxide.

8. The method of claim 1, wherein the offset spacer includes an oxide/nitride/oxide (ONO) composite stack layer.

9. A method of fabricating a metal oxide semiconductor (MOS) transistor, comprising:
   providing a substrate;
   forming a gate structure on the substrate;
   forming an offset spacer on respective sidewalls of the gate structure;
   performing a first ion implantation process to form a lightly doped drain (LDD) in the substrate beside the gate structure;
   forming a spacer on respective sidewalls of the offset spacer;
   performing a second ion implantation process to form a source and a drain in the substrate beside the spacer;
   forming a metal silicide layer on the surface of the source and the drain;
   removing a portion of the spacer using hot phosphoric acid so that a portion of the spacer remains;
   rinsing with de-ionized water (DI water) to form an oxide layer on the surface of the metal silicide layer; and
   removing the remaining spacer using hot phosphoric acid; and
   forming an etching stop layer over the substrate to cover the oxide layer, the offset spacer and the gate structure.

10. The method of claim 9, wherein the material constituting the spacers comprises silicon nitride.

11. The method of claim 9, wherein the oxide layer has a thickness between about 10 Å to 30 Å.

12. The method of claim 9, wherein the material constituting the etching stop layer comprises silicon nitride.

13. The method of claim 9, wherein the material constituting the metal silicide is selected from a group consisting of nickel silicide, cobalt silicide, platinum silicide, palladium silicide, molybdenum silicide and an alloy of some of the above metal silicide.

14. The method of claim 9, wherein the material constituting the offset spacers comprises silicon oxide.

15. The method of claim 9, wherein the offset spacer includes an oxide/nitride/oxide (ONO) composite stack layer.

16. A method of fabricating a metal oxide semiconductor (MOS) transistor, comprising:
- providing a substrate;
- forming a gate structure on the substrate;
- forming an offset spacer on respective sidewalls of the gate structure;
- performing a first ion implantation process to form a lightly doped drain (LDD) in the substrate beside the gate structure;
- forming a spacer on respective sidewalls of the offset spacer;
- performing a second ion implantation process to form a source and a drain in the substrate beside the spacer;
- forming a metal silicide layer on the surface of the source and the drain;
- removing a portion of the spacers using hot phosphoric acid so that a portion of the spacer remains;
- performing a deionized water and ozone (DI-$O_3$) treatment to form an oxide layer on the surface of the metal silicide layer; and
- removing the remaining spacer using hot phosphoric acid; and
- forming an etching stop layer over the substrate to cover the oxide layer, the offset spacer and the gate structure.

17. The method of claim 16, wherein the material constituting the spacers comprises silicon nitride.

18. The method of claim 16, wherein the oxide layer has a thickness between about 10 Å to 30 Å.

19. The method of claim 16, wherein the material constituting the etching stop layer comprises silicon nitride.

20. The method of claim 16, wherein the material constituting the metal silicide is selected from a group consisting of nickel silicide, cobalt silicide, platinum silicide, palladium silicide, molybdenum silicide and an alloy of some of the above metal silicide.

21. The method of claim 16, wherein the material constituting the offset spacers comprises silicon oxide.

22. The method of claim 16, wherein the offset spacer includes an oxide/nitride/oxide (ONO) composite stack layer.

* * * * *